United States Patent
Kuo et al.

(10) Patent No.: US 9,679,915 B2
(45) Date of Patent: Jun. 13, 2017

(54) INTEGRATED CIRCUIT WITH WELL AND SUBSTRATE CONTACTS

(71) Applicant: TAIWAN SEMICONDUCTOR MANUFACTURING COMPANY, LTD., Hsinchu (TW)

(72) Inventors: Ming-Zhang Kuo, Qionglin Township (TW); Ho-Chieh Hsieh, Hsinchu (TW); Hui-Zhong Zhuang, Kaohsiung (TW); Kuo-Feng Tseng, Taipei (TW); Lee-Chung Lu, Taipei (TW); Cheng-Chung Lin, Hsinchu (TW); Sang Hoo Dhong, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/876,123

(22) Filed: Oct. 6, 2015

(65) Prior Publication Data
US 2016/0336343 A1  Nov. 17, 2016

Related U.S. Application Data

(60) Provisional application No. 62/162,008, filed on May 15, 2015.

(51) Int. Cl.
*H01L 27/118* (2006.01)

(52) U.S. Cl.
CPC . *H01L 27/11807* (2013.01); *H01L 2027/1189* (2013.01); *H01L 2027/11855* (2013.01); *H01L 2027/11861* (2013.01)

(58) Field of Classification Search
CPC ... H01L 2027/11855; H01L 2027/1189; H01L 27/11807
See application file for complete search history.

(56) References Cited

U.S. PATENT DOCUMENTS

| | | | |
|---|---|---|---|
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 2013/0335875 A1* | 12/2013 | Baumann | G11C 5/005 361/111 |
| 2014/0183602 A1* | 7/2014 | Gurumurthy | H01L 27/0207 257/202 |

(Continued)

*Primary Examiner* — Daniel Shook
(74) *Attorney, Agent, or Firm* — Hauptman Ham, LLP

(57) ABSTRACT

An integrated circuit comprises standard cells arranged in rows and columns. The integrated circuit also comprises tap cells arranged in rows and columns. The tap cells each comprise a substrate having a first dopant type and a thickness from a first surface of the substrate to a second surface of the substrate. The integrated circuit further comprises a well region in the substrate having a second dopant type different from the first dopant type and a depth from the first surface of the substrate less than the thickness of the substrate. The integrated circuit additionally comprises a first quantity of rows of tap cells and a second quantity of rows of tap cells less than the first quantity. Each row of the first quantity of rows of tap cells comprises at least one well contact, and each row of tap cells of the second quantity of tap cells comprises at least one substrate contact.

20 Claims, 6 Drawing Sheets

(56) References Cited

U.S. PATENT DOCUMENTS

2014/0215420 A1 7/2014 Lin et al.
2014/0264924 A1 9/2014 Yu et al.
2014/0282289 A1 9/2014 Hsu et al.
2014/0325466 A1 10/2014 Ke et al.

* cited by examiner

INTEGRATED CIRCUIT WITH WELL AND SUBSTRATE CONTACTS

BACKGROUND

Some integrated circuits are designed using, and manufactured based on, standard cells that are included in a standard cell library. Standard cells are, for example, circuits that are configured to be used to perform logic functions. For example, a standard cell sometimes includes transistors arranged as a NAND gate, a NOR gate, an inverter, or to serve some other suitable logic function. As integrated circuits become smaller in physical size, and the quantity of transistors included in the device increases, smaller line widths are used in the integrated circuits, and the transistors therein are located closer together. Latchup is a type of short circuit that sometimes occurs in integrated circuits. To prevent latchup, some integrated circuits include tap cells. Tap cells comprise well and substrate taps. Tap cells; however, increase the overall size of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
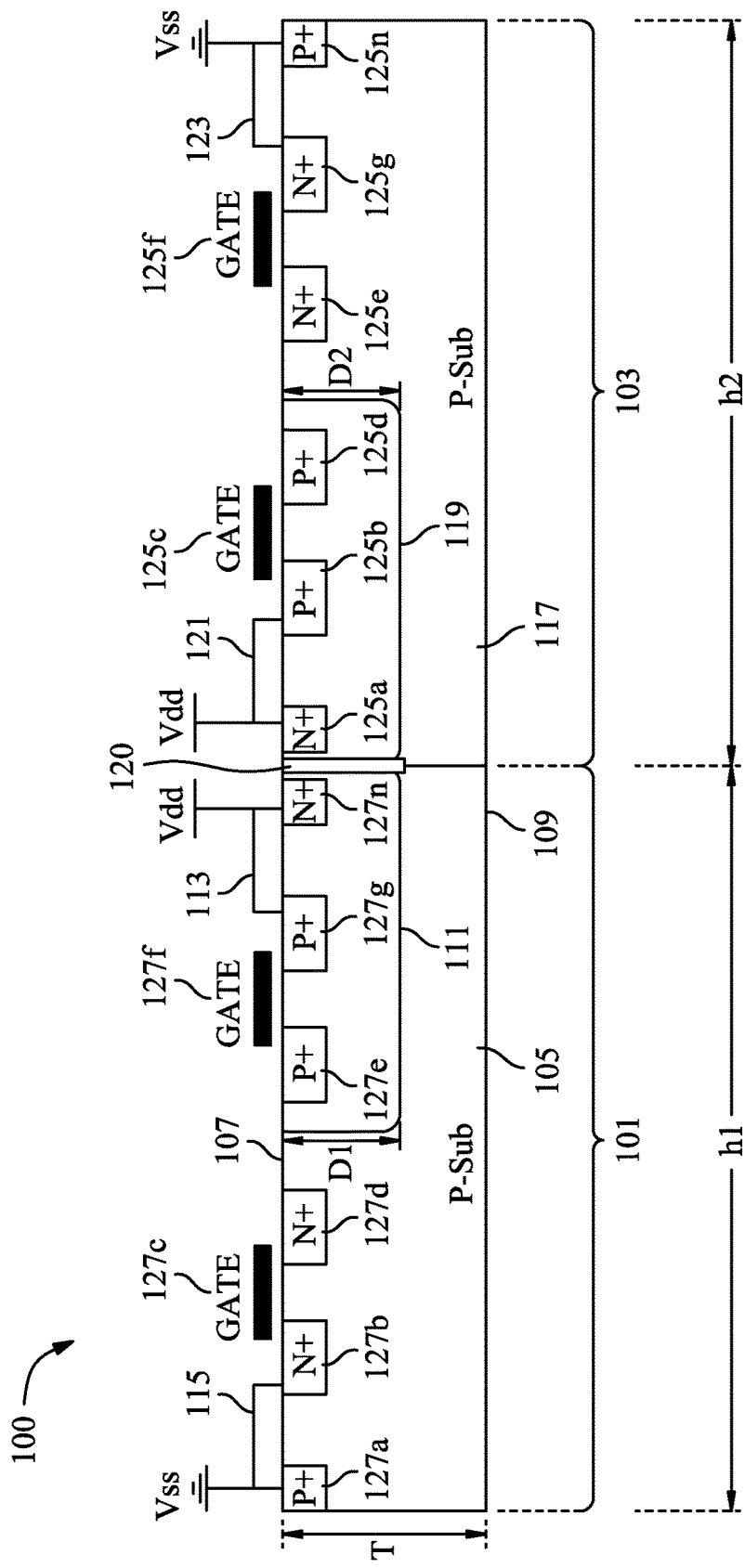
FIG. 1 is a side view of an integrated circuit comprising a tap cell that is adjacent a standard cell, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuits comprise standard cells and tap cells that are arranged in columns and rows. Standard cells are portions of an integrated circuit that are arranged to perform a designed operation or function. Tap cells are included in integrated circuits to prevent occurrence of a short-circuit such as latchup in the integrated circuit. Standard cells and tap cells in an integrated circuit sometimes share a cell height measured in a column direction. The tap cells usually include a well tap such as an n-well tap and a substrate tap in each well and substrate row, respectively. A tap cell that includes a well tap and a substrate tap in each well and substrate row usually occupies one cell height. A tap cell that includes a well tap and a substrate tap in one cell height, however, has a width such that the tap cell is capable of accommodating both the well tap and the substrate tap. Including a well tap and a substrate tap in each tap cell results in a tap cell width that is larger than a tap cell that has only one of a well tap or a substrate tap. A large tap cell consumes area in an integrated circuit that could otherwise be used by a standard cell, for other circuitry included in the integrated circuit, or eliminated to help reduce an overall physical size of the integrated circuit.

FIG. 1 is a side view of an integrated circuit 100 comprising a tap cell 101 that is adjacent a standard cell 103, in accordance with one or more embodiments.

Tap cell 101 comprises a substrate 105. Substrate 105 comprises a semiconductor material such as silicon, or another suitable substrate material usable for manufacturing an integrated circuit. Substrate 105 has a first dopant type. In some embodiments, substrate 105 has a p-type dopant type. In other embodiments, substrate 105 has an n-type dopant type. Substrate 105 has a thickness T from a first surface 107 of the substrate 105 to a second surface 109 of the substrate 105. In some embodiments, first surface 107 is an upper surface and second surface 109 is a lower surface.

Tap cell 101 also comprises a well region 111 in the substrate 105. The well region 111 has a second dopant type different from the first dopant type. For example, if the substrate 105 has a p-type dopant type, then the well region 111 has an n-type dopant type. Alternatively, if the substrate 105 has an n-type dopant type, then the well region 111 has a p-type dopant type. Well region 111 has a depth D1 from the first surface 107 of the substrate 105 less than the thickness T of the substrate 105. Tap cell 101 further comprises a well contact 113 and a substrate contact 115. In some embodiments, well contact 113 is configured to carry a voltage Vdd and substrate contact 115 is configured to carry a voltage Vss. In some embodiments, well contact 113 is configured to carry voltage Vss and substrate contact 115 is configured to carry voltage Vdd.

Standard cell 103 comprises a substrate 117. Substrate 117 has the first dopant type. In some embodiments, substrate 117 is a same substrate material as substrate 105. In some embodiments, substrate 117 is a separate substrate material that is in contact with substrate 105. In some embodiments, substrate 117 is in direct physical contact with substrate 105. In other embodiments, substrate 117 is electrically coupled with substrate 105. In some embodiments, substrate 105 and substrate 117 are representative of different regions in a same substrate usable to form the tap cell 101 and the standard cell 103.

Standard cell 103 also comprises a well region 119. Well region 119 has the second dopant type. Well region 119 has a depth D2 less than the thickness T of the substrate 117. In some embodiments, depth D2 is equal to depth D1. In other embodiments, depth D2 is different from depth D1. Well region 119 is electrically isolated from well region 111 by an isolation region 120. Isolation region 120 is formed in one or both of tap cell 101 or standard cell 103. Standard cell 103 further comprises a well contact 121 and a substrate contact 123.

Standard cell 103 comprises circuit features 125a-125n (collectively referred to as circuit features 125). Circuit features 125 comprise, for example, source regions, drain regions, gates, wells, or other suitable features usable to configure the standard cell 103 to be usable for a designed logic function. Tap cell 101 comprises circuit features 127a-127n (collectively referred to as circuit features 127). Circuit features 127 are similar to circuit features 125. In some embodiments, circuit features 127 are different from circuit features 125. In some embodiments, tap cell 101 is free from circuit features 127.

Figure 2:
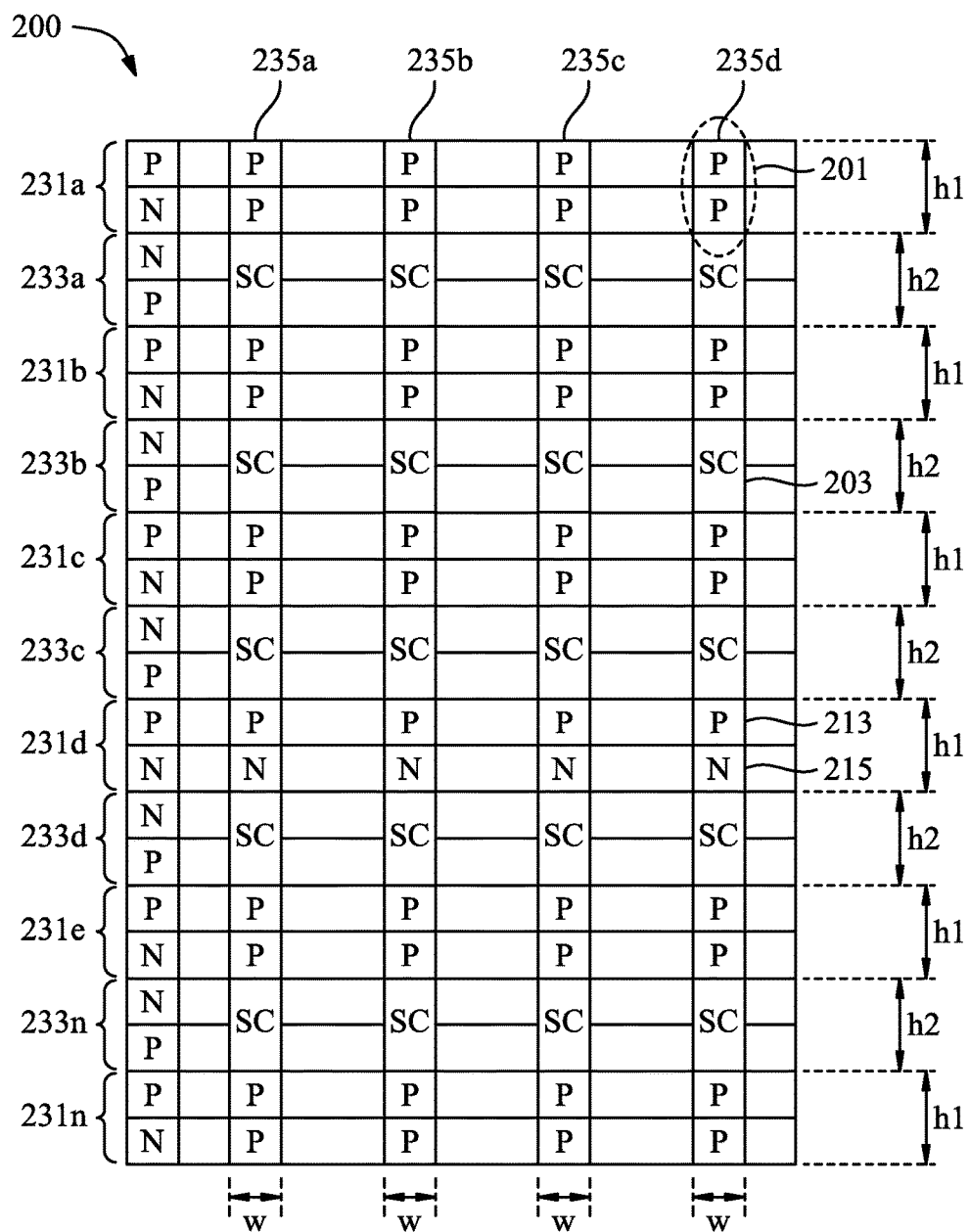
FIG. 2 is a plan view of an integrated circuit that comprises tap cells arranged in rows and columns and standard cells arranged in rows and columns, in accordance with one or more embodiments.

Tap cell 101 has a height h1 in a plan view (e.g., FIG. 2). The height h1, when viewed in a cross-section view such as FIG. 1 appears as a width of the tap cell 101. Standard cell 103 has a height h2 in a plan view (e.g., FIG. 2). The height h2, when viewed in a cross-section view such as FIG. 1 appears as a width of the standard cell 103. In a plan view of integrated circuit 101, height h1 of tap cell 101 is about equal to height h2 of standard cell 103.

Though the substrates, well regions and circuit features included in tap cell 101 and standard cell 103 are illustrated as having a "P" or an "N" dopant type for ease of discussion, one of ordinary skill in the art would recognize that these labels could be readily reversed in order to correspond to the embodiments discussed throughout this description.

FIG. 2 is a plan view of an integrated circuit 200 that comprises tap cells 201 arranged in rows and columns and standard cells 203 arranged in rows and columns, in accordance with one or more embodiments. For simplicity, only one tap cell 201 and one standard cell 203 are labeled.

Tap cells 201 comprise many of the features discussed with respect to tap cells 101 (FIG. 1), with the reference numerals increased by 100. Some of the tap cells 201 are free from including a substrate contact 215. Tap cells 201 have cell height h1 and standard cells 203 have cell height h2. Cell height h1 of the tap cells 201 is about equal to cell height h2 of standard cells 203. In integrated circuit 200, tap cells 201 and standard cells 203 have widths equal to about one cell width w.

Integrated circuit 200 comprises tap cell rows 231a-231n (collectively referred to herein as tap cell row 231) and standard cell rows 233a-233n (collectively referred to herein as standard cell row 233). The standard cells 203 included in the standard cell row 233 are between the tap cells 201 included in the tap cell rows 231. As such, integrated circuit 200 includes columns 235a-235d (collectively referred to herein as column 235) that comprise alternating standard cells 233 and tap cells 201. While FIG. 2 depicts four columns 235a-235d as column 235, various embodiments include four columns or greater or fewer than four columns as column 235.

A first quantity of tap cell rows 231 each comprises at least one well contact 213. A second quantity of tap cell rows 231 each comprises at least one substrate contact 215. In some embodiments, all of the tap cells 201 included in integrated circuit 200 comprise a well contact 213 and fewer than all of the tap cells 201 included in integrated circuit 200 comprise a substrate contact 215. Accordingly, in some embodiments, the integrated circuit 200 comprises a greater quantity of well contacts 213 than substrate contacts 215. So as to avoid obscuring the figures, well contacts 213 are represented by the letter "P" and substrate contacts 215 are represented by the letter "N."

By using tap cells and standard cells that are generally configured in accordance with the tap cell 101 and the standard cell 103 discussed with respect to FIG. 1 (i.e., tap cells and standard cells that are electrically coupled to one another via the substrate), some of the tap cells included in the circuit need not all comprise both substrate contacts 215 and well contacts 213. Instead, the coupling of the substrates of the tap cells and the standard cells helps to minimize an amount of area of the integrated circuit 200 that is consumed by tap cells 201.

Figure 3:
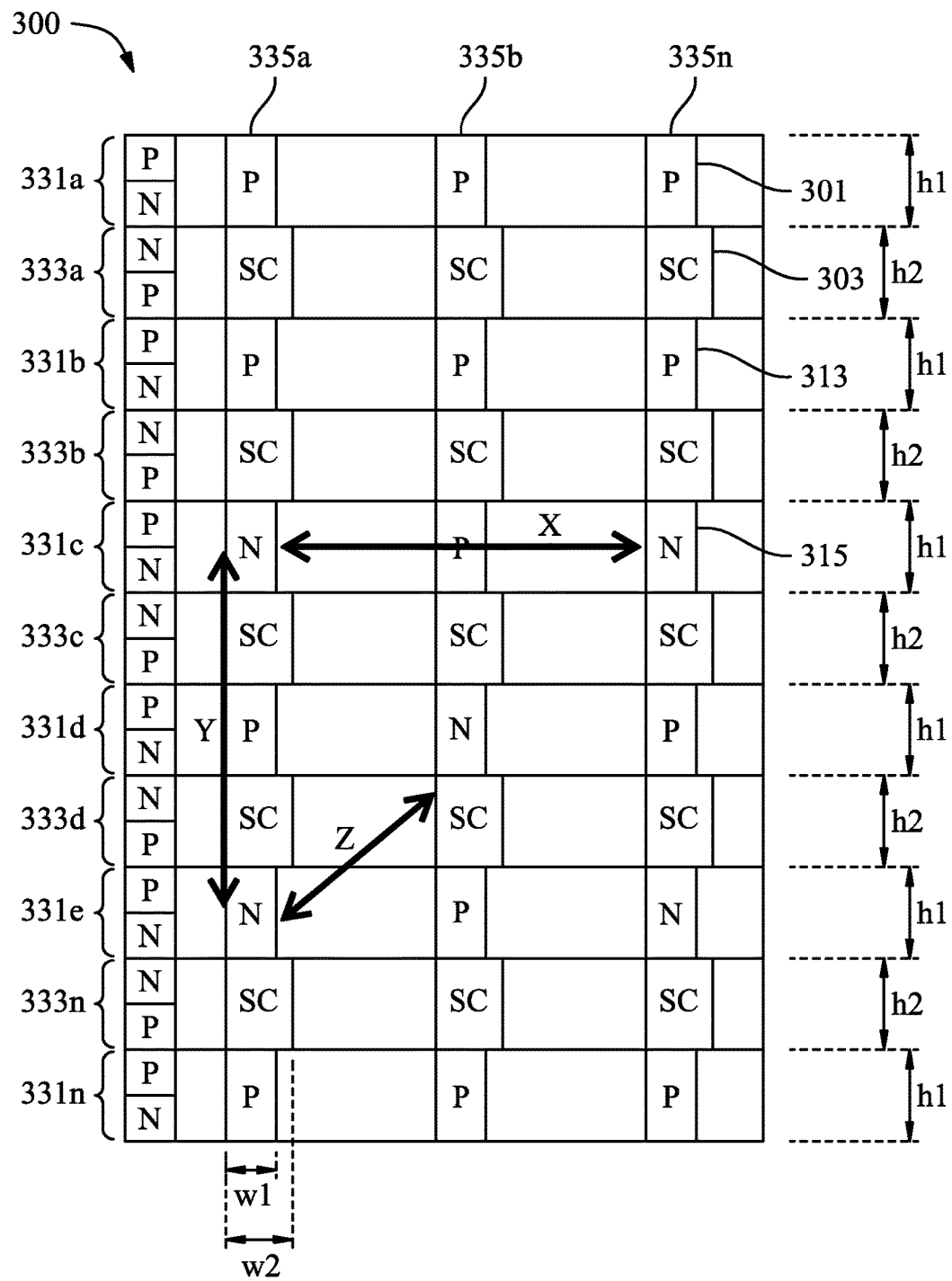
FIG. 3 is a plan view of an integrated circuit that comprises tap cells arranged in rows and columns and standard cells arranged in rows and columns, in accordance with one or more embodiments.

FIG. 3 is a plan view of an integrated circuit 300 that comprises tap cells 301 arranged in rows and columns and standard cells 303 arranged in rows and columns, in accordance with one or more embodiments. For simplicity, only one tap cell 301 and one standard cell 303 are labeled.

Integrated circuit 300 is similar to integrated circuit 200 (FIG. 2), with the reference numerals increased by 100. In integrated circuit 300, some of the tap cells 301 are free from including a well contact 313 and some of the tap cells 301 are free from including a substrate contact 315. For simplicity, only one well contact 313 and one substrate contact 315 are labeled. The well contacts 313 have a height equal to about one cell height h1 of a corresponding tap cell 301 between standard cells 303. Similarly, the substrate contacts 315 have a height equal to about one cell height h1 of a corresponding tap cell between standard cells 303. The standard cells 303 have a cell height h2. The cell height h2 is about equal to the cell height h1 of the tap cells 101.

The tap cells 301 have a width equal to about one first cell width w1 and the standard cells 303 have a width equal to about one second cell width w2. Because the tap cells 301 are either free from having a well contact 313 or free from having a substrate contact 315, the width w1 of the corresponding tap cell 301 is optionally less than the width w2 of an adjacent standard cell 303. In some embodiments, the width w1 of the corresponding tap cell 301 is about equal to the width w2 of an adjacent standard cell 303 similar to the width w discussed with respect to FIG. 2. In some embodiments, the width w1 of the corresponding tap cell 301 is optionally greater than the width w2 of an adjacent standard cell 303. Reducing the width of the tap cell 301 compared to the width of the standard cells 303 helps to save space in the integrated circuit 300. In some embodiments, because the tap cells 301 are either free from having a well contact 313 or free from having a substrate contact 315, the width w1 of the corresponding tap cell 301 is capable of being less than a tap cell that includes both a well contact and a substrate contact. The reduction in width of the tap cells 301 compared to the width of tap cells that include both a well contact and a substrate contact helps to save space in the integrated circuit 300. The space that is saved is capable of being used for standard cells 303 or other circuitry in the integrated circuit 300, or otherwise eliminated from the integrated circuit 300 to reduce an overall size of the integrated circuit 300.

Figure 6:
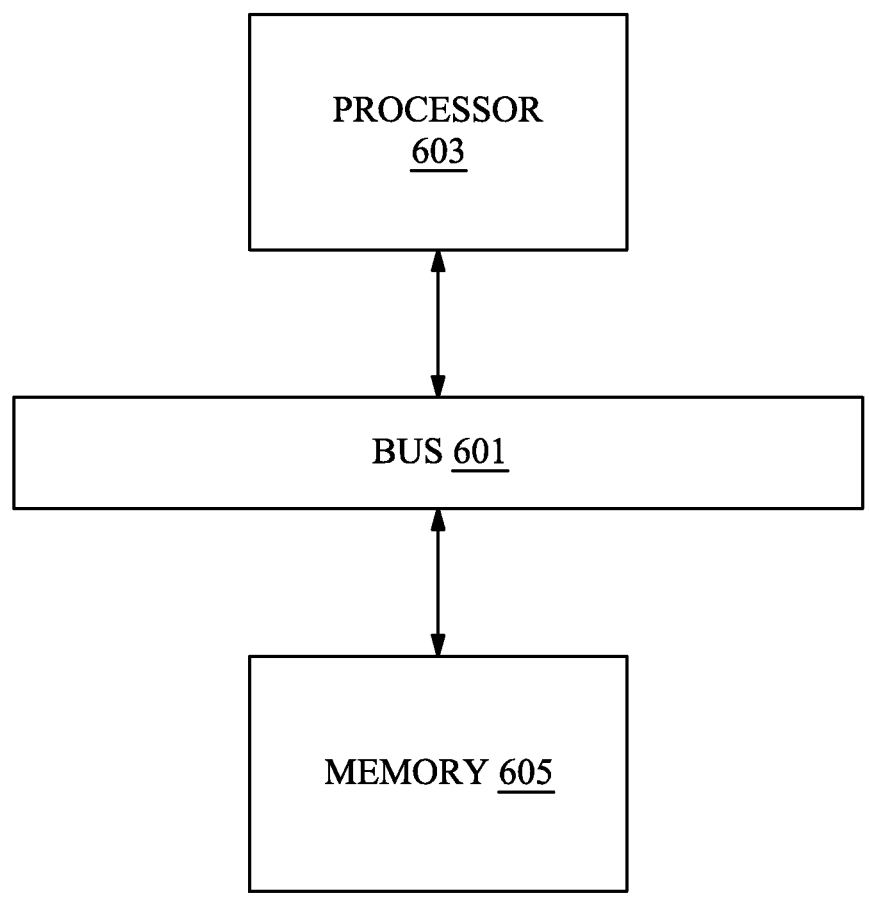
FIG. 6 is a functional block diagram of a computer or processor-based system upon which or by which at least one embodiment is implemented.

Integrated circuit 300 is manufactured using an integrated circuit design system implemented by a processor, such as processor 603 of FIG. 6. The design system has an established design rule that specifies a maximum distance between substrate contacts 315 to prevent a short circuit such as latchup in the integrated circuit 300. The tap cells 301 containing substrate contacts 315 in a same tap cell row 331 of tap cells 301 are separated by a distance x that is greater than the maximum distance set by the design rule and less than twice the maximum distance set by the design rule. Similarly, the tap cells 301 containing substrate contacts 315 in a same tap cell column 335 of standard cells 303 and tap cells 301 are separated by a distance y that is greater than the maximum distance set by the design rule and less than twice the maximum distance set by the design rule. In a diagonal direction, the tap cells 301 containing substrate contacts 315 are separated by a distance z that is less than or equal to the maximum distance set by the design rule to prevent latchup. Because the tap cells 301 are separated in the diagonal direction by the distance z, which is in compliance with the design rule to prevent latchup, the distance between the tap cells in the same row or column is capable of being maximized while keeping the integrated circuit 300 being in compliance with the design rule to prevent latchup. Accordingly, integrated circuit 300 is populated with a minimum quantity of substrate contacts 315 while being in compliance with the design rule. In some embodiments, the design rule sets the maximum spacing between substrate contacts 315 at about 60 nanometers (nm). An integrated circuit that has substrate contacts at distances that are at the maximum allowed by the design rule to prevent latchup saves space in the integrated circuit for standard cells or other circuitry compared to an integrated circuit that includes a substrate contact in every tap cell row 331.

Figure 4:
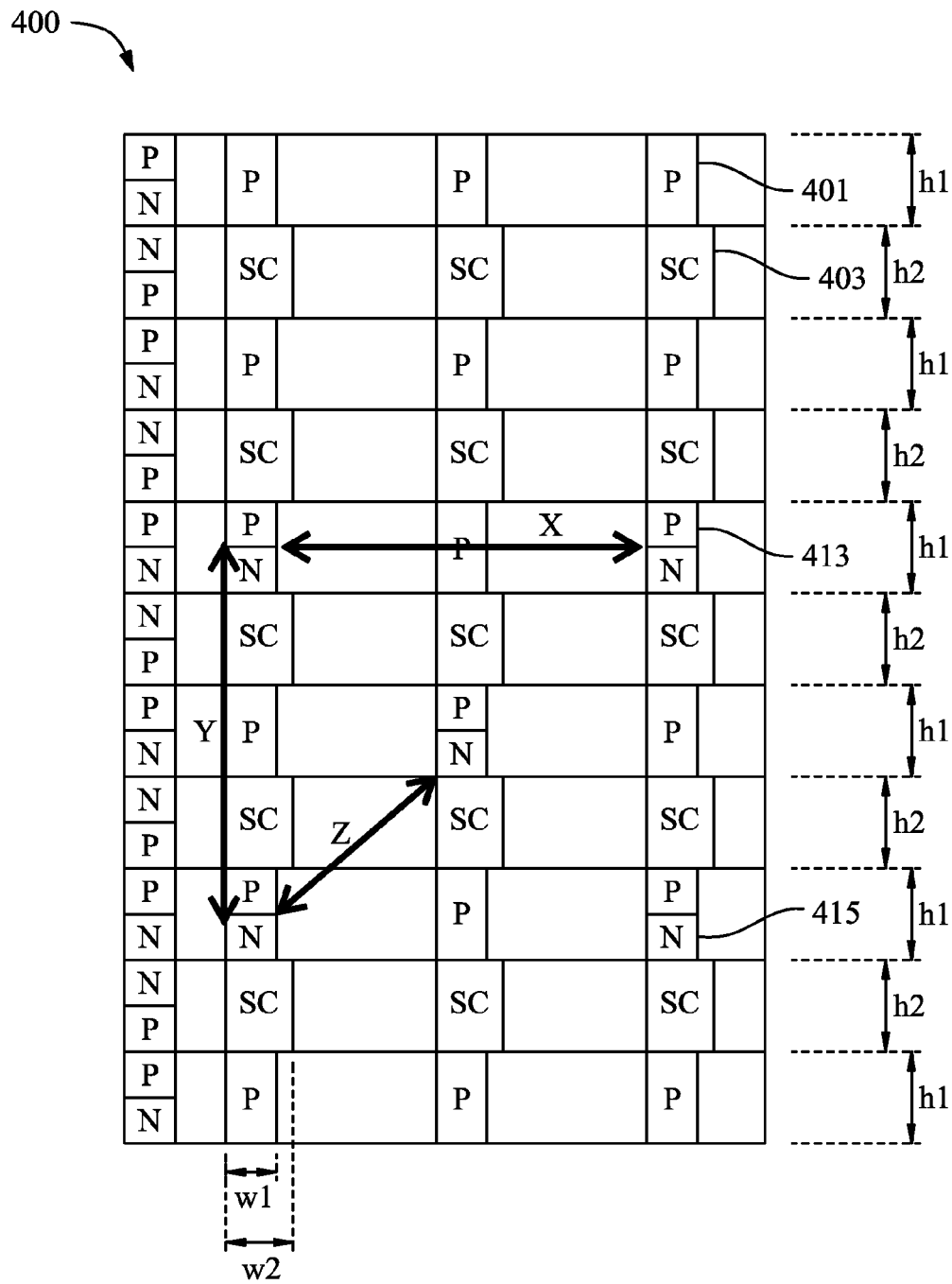
FIG. 4 is a plan view of an integrated circuit that comprises tap cells arranged in rows and columns and standard cells arranged in rows and columns, in accordance with one or more embodiments.

FIG. 4 is a plan view of an integrated circuit 400 that comprises tap cells 401 arranged in rows and columns and standard cells 403 arranged in rows and columns, in accordance with one or more embodiments. For simplicity, only one tap cell 401 and one standard cell 403 are labeled. For simplicity, only one well contact 413 and one substrate contact 415 are labeled.

Integrated circuit 400 is similar to integrated circuit 300 (FIG. 3), with the reference numerals increased by 100. In integrated circuit 400, the tap cells 401 have a height h1 and the standard cells 403 have a height h2. Height h1 of the tap cells 401 is about equal to height h2 of the standard cells 403. Some of the well contacts 413 have a height equal to about one cell height h1 of the tap cell 401 between standard cells 403. Tap cells 401 that include substrate contacts 415 have well contacts 413 having a height equal to about half of the cell height h1 of the corresponding tap cell 401 and a substrate contact 415 having a height equal to about half of the cell height h1 of the corresponding tap cell 401. Some of the tap cells 401 have a width equal to about the first cell width w1 and some of the tap cells 401 have a width equal to about the second cell width w2. Width w1 is less than width w2. The standard cells 403 have width equal to about the second cell width w2. In other words, the tap cells 401 that include substrate contacts 415 have a width that is substantially equal to the width of the standard cells 403. The tap cells 401 that are free from a substrate contact 415 have a width that is less than the width of the standard cells 403 and less than the width of the tap cells 401 that include both the well contact 413 and the substrate contact 415. In some embodiments, the tap cells 401 that include substrate contact 415 have a width that is greater than the width of the standard cells 403 but less than the width of the tap cells 401 that include both the well contact 413 and the substrate contact 415.

Substrate contacts 415 are separated from each other by a distance x or a distance y. Distance x and distance y are greater than the maximum distance set by the design rule and less than twice the maximum distance set by the design rule. In the diagonal direction, the substrate contacts 415 of the tap cells 401 are separated by distance z that is less than or equal to the maximum distance set by the design rule to prevent latchup.

Figure 5:
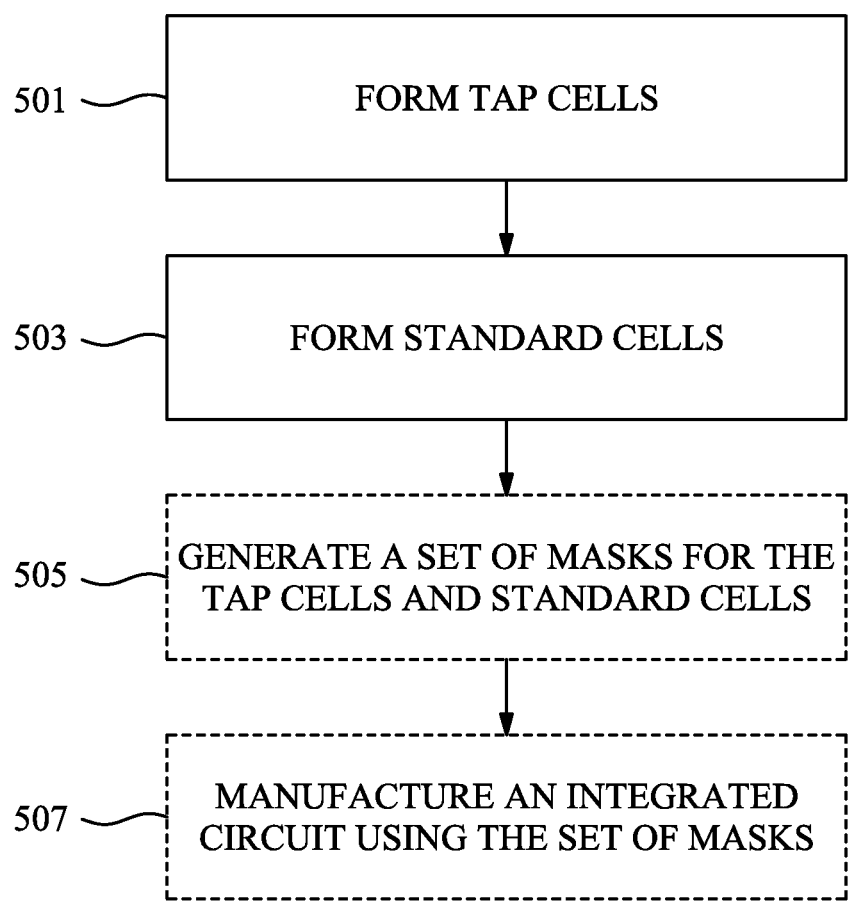
FIG. 5 is a flowchart of a method of forming an integrated circuit, in accordance with one or more embodiments.

FIG. 5 is a flowchart of a method 500 of forming an integrated circuit, in accordance with one or more embodiments. In some embodiments, an integrated circuit is manufactured by performing one or more lithographic processes, growing processes, etching processes, or other processes based on a set of masks. In some embodiments, a set of masks is fabricated based on an integrated circuit design layout that depicts a plurality of features of the integrated circuit in various component layers.

In operation 501, rows and columns of tap cells such as tap cells are formed. Each tap cell is formed by forming a well region in a substrate by implanting a dopant in the well region causing the substrate to have a first dopant type and the well region to have a second dopant type different from the first dopant type. In some embodiments, the implanted dopant is a p-type dopant. In some embodiments, the implanted dopant is an n-type dopant. A first quantity of rows of tap cells is formed having at least one well contact in each row of the first quantity of rows of tap cells. A second quantity of rows of tap cells less than the first quantity is formed having at least one substrate contact in each row of the second quantity of tap cells. In some embodiments, a column of tap cells is formed having spaces available between the tap cells in which a column of standard cells is formed. In some embodiments, the substrate contacts of the tap cells included in the second quantity of rows of tap cells are formed in positions in a same row or column that are separated by a distance greater than a maximum distance set by a design rule and less than twice the maximum distance set by the design rule. In some embodiments, the substrate contacts are separated, in a diagonal direction, by a distance that is less than or equal to the maximum distance set by the design rule to prevent latchup.

In operation 503, rows and columns of standard cells are formed. A row of standard cells is formed between two rows of tap cells. In some embodiments, the standard cells are formed in the spaces between the tap cells, thereby forming a column of standard cells and tap cells comprising alternating standard cells and tap cells. In some embodiments, the standard cells are each formed by forming another well region having the second dopant type in the substrate. The well region formed in the substrate for the standard cell is formed in a position electrically isolated from the well region of the tap cell.

In some embodiments, in operation 505, a set of masks is generated for the tap cells and standard cells of operations 501 and 503. In some embodiments, in operation 507, an integrated circuit is manufactured using the set of masks generated in operation 505.

FIG. 6 is a functional block diagram of a computer or processor-based system 600 upon which or by which an embodiment is implemented.

Processor-based system 600 is programmable to generate masks usable for manufacturing an integrated circuit comprising tap cells, as described herein, and includes, for example, bus 601, processor 603, and memory 605 components.

In some embodiments, the processor-based system is implemented as a single "system on a chip." Processor-based system 600, or a portion thereof, constitutes a mechanism for designing an integrated circuit. In some embodiments, the processor-based system 600 includes a communication mechanism such as bus 601 for transferring information and/or instructions among the components of the processor-based system 600. Processor 603 is connected to the bus 601 to obtain instructions for execution and process information stored in, for example, the memory 605. In some embodiments, the processor 603 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 603. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 603 performs a set of operations on information as specified by a set of instructions stored in memory 605 related to protecting an integrated circuit from excessive voltages, the hot carrier effect, and/or voltage overstressing. The execution of the instructions causes the processor to perform specified functions.

The processor 603 and accompanying components are connected to the memory 605 via the bus 601. The memory 605 includes one or more of dynamic memory (e.g., RAM, magnetic disk, writable optical disk, etc.) and static memory (e.g., ROM, CD-ROM, etc.) for storing executable instructions that when executed perform the steps described herein to generate an integrated circuit comprising tap cells. The memory 605 also stores the data associated with or generated by the execution of the steps.

In one or more embodiments, the memory 605, such as a random access memory (RAM) or any other dynamic storage device, stores information including processor instructions for generating an integrated circuit comprising tap cells. Dynamic memory allows information stored therein to be changed. RAM allows a unit of information stored at a location called a memory address to be stored and retrieved independently of information at neighboring addresses. The memory 605 is also used by the processor 603 to store temporary values during execution of processor instructions. In various embodiments, the memory 605 is a read only memory (ROM) or any other static storage device coupled to the bus 601 for storing static information, including instructions, that is not changed. Some memory is composed of volatile storage that loses the information stored thereon when power is lost. In some embodiments, the memory 605 is a non-volatile (persistent) storage device, such as a magnetic disk, optical disk or flash card, for storing information, including instructions, that persists even when power supplied to the memory 605 is turned off.

The term "computer-readable medium" as used herein refers to any medium that participates in providing information to processor 603, including instructions for execution. Such a medium takes many forms, including, but not limited to computer-readable readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this description relates to an integrated circuit. The integrated circuit comprises standard cells arranged in rows and columns. The integrated circuit also comprises tap cells arranged in rows and columns. The tap cells each comprise a substrate having a first dopant type and a thickness from a first surface of the substrate to a second surface of the substrate. The tap cells also each comprise a well region in the substrate having a second dopant type different from the first dopant type and a depth from the first surface of the substrate less than the thickness of the substrate. The integrated circuit additionally comprises a first quantity of rows of tap cells and a second quantity of rows of tap cells less than the first quantity. Each row of the first quantity of rows of tap cells comprises at least one well contact, and each row of tap cells of the second quantity of tap cells comprises at least one substrate contact.

Another aspect of this description relates to a method of forming an integrated circuit. The method comprises forming rows and columns of tap cells. Each tap cell is formed by forming a well region in a substrate by implanting a dopant in the well region. The implantation causes the substrate to have a first dopant type and the well region to have a second dopant type different from the first dopant type. The method also comprises forming rows and columns of standard cells. A first quantity of rows of tap cells is formed having at least one well contact in each row of the first quantity of rows of tap cells. A second quantity of rows of tap cells less than the first quantity is formed having at least one substrate contact in each row of the second quantity of tap cells.

A further aspect of this description relates to an integrated circuit. The integrated circuit comprises standard cells arranged in rows and columns. The integrated circuit also comprises tap cells arranged in rows and columns. The tap cells each comprise a substrate having a first dopant type. The tap cells also each comprise a well region in the substrate having a second dopant type different from the first dopant type. Fewer than a total quantity of tap cells included in the integrated circuit comprise a substrate contact, and a different quantity of tap cells comprise a well contact. Substrate contacts in a same column of tap cells are separated by a distance greater than a maximum distance set by a design rule established by an integrated circuit design system specifying the maximum distance between substrate contacts to prevent latchup.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
standard cells arranged in rows and columns; and
tap cells arranged in rows and columns, the tap cells each comprising:
   a substrate having a first dopant type and a thickness from a first surface of the substrate to a second surface of the substrate; and
   a well region in the substrate, wherein the well region has a second dopant type different from the first dopant type and a depth from the first surface of the substrate less than the thickness of the substrate,
wherein
the integrated circuit comprises a first quantity of rows of tap cells and a second quantity of rows of tap cells less than the first quantity,
each row of the first quantity of rows of tap cells comprises at least one well contact,
each row of tap cells of the second quantity of tap cells comprises at least one substrate contact, and
a quantity of well contacts is greater than a quantity of substrate contacts.

2. The integrated circuit of claim 1, wherein a row of standard cells is between two rows of tap cells.

3. The integrated circuit of claim 1, wherein a column of standard cells and tap cells comprises alternating standard cells and tap cells.

4. The integrated circuit of claim 1, wherein the well region is a first well region and the standard cells each comprise:
   the substrate; and
   a second well region having the second dopant type and a depth less than the thickness of the substrate.

5. The integrated circuit of claim 4, wherein the first well region is electrically isolated from the second well region.

6. The integrated circuit of claim 1, wherein
the substrate contacts of the tap cells included in the second quantity of rows of tap cells are separated by a distance greater than a maximum distance set by a design rule and less than twice the maximum distance set by the design rule, and
the design rule is a rule established by an integrated circuit design system specifying the maximum distance between substrate contacts to prevent latchup.

7. The integrated circuit of claim 1, wherein the tap cells have a cell height and the well region of at least one tap cell has a height equal to about the cell height.

8. The integrated circuit of claim 1, wherein the first dopant type is a p-type dopant and the second dopant type is an n-type dopant.

9. The integrated circuit of claim 1, wherein the first dopant type is an n-type dopant and the second dopant type is a p-type dopant.

10. The integrated circuit of claim 1, wherein a width of at least one tap cell is less than a width of an adjacent standard cell.

11. A method of forming an integrated circuit, comprising:
forming rows and columns of tap cells, each tap cell being formed by implanting a dopant in a substrate to form a well region, wherein a dopant type of the substrate is different from a dopant type of the well region; and
forming rows and columns of standard cells,
wherein
a first quantity of rows of tap cells is formed having at least one well contact in each row of the first quantity of rows of tap cells,
a second quantity of rows of tap cells less than the first quantity is formed having at least one substrate contact in each row of the second quantity of rows of tap cells, and
a greater quantity of well contacts than a quantity of substrate contacts are formed.

12. The method of claim 11, wherein a row of standard cells is formed between two rows of tap cells.

13. The method of claim 11, wherein a column of tap cells is formed having spaces available between the tap cells in which a column of standard cells is formed, thereby forming a column of standard cells and tap cells comprising alternating standard cells and tap cells.

14. The method of claim 11, wherein the well region is a first well region and the standard cells are each formed by:
forming a second well region in the substrate, the second well region being formed in the substrate in a position electrically isolated from the first well region, and the second well region having a same dopant type as the first well region.

15. The method of claim 11, further comprising:
forming the substrate contacts of the tap cells included in the second quantity of rows of tap cells in positions separated by a distance greater than a maximum distance set by a design rule and less than twice the maximum distance set by the design rule,
wherein the design rule is a rule established by an integrated circuit design system specifying the maximum distance between substrate contacts to prevent latchup.

16. The method of claim 11, wherein the tap cells are formed having a cell height and the well region of at least one tap cell is formed having a height equal to about the cell height.

17. The method of claim 11, wherein the implanted dopant is a p-type dopant.

18. The method of claim 11, wherein the implanted dopant is an n-type dopant.

19. The method of claim 11, wherein at least one tap cell having a first width is formed adjacent to a standard cell having a second width, the second width being greater than the first width.

20. An integrated circuit, comprising:
standard cells arranged in rows and columns; and
tap cells arranged in rows and columns, the tap cells each comprising:
   a substrate having a first dopant type; and
   a well region in the substrate having a second dopant type different from the first dopant type,
wherein
fewer than a total quantity of tap cells included in the integrated circuit comprise a substrate contact,
a different quantity of tap cells comprise a well contact, and
substrate contacts in a same column of tap cells are separated by a distance greater than a maximum distance set by a design rule established by an integrated circuit design system specifying the maximum distance between substrate contacts to prevent latchup.

* * * * *